United States Patent [19]

Ducreux

[11] Patent Number: 5,281,550
[45] Date of Patent: Jan. 25, 1994

[54] METHOD FOR ETCHING A DEEP GROOVE IN A SILICON SUBSTRATE

[75] Inventor: Gérard Ducreux, Luynes, France

[73] Assignee: SGS-Thomson Microelectronics S.A., Pouilly, France

[21] Appl. No.: 975,883

[22] Filed: Nov. 13, 1992

[30] Foreign Application Priority Data

Nov. 14, 1991 [FR] France .................. 91 14366

[51] Int. Cl.$^5$ .................................. H01L 21/76
[52] U.S. Cl. ............................. 437/65; 437/67
[58] Field of Search .................. 437/65, 67; 148/DIG. 50, DIG. 85, DIG. 86; 156/644

[56] References Cited

U.S. PATENT DOCUMENTS 4,465,532  8/1984  Fukano .
4,563,227  1/1986  Sakai et al. .
4,663,832  5/1987  Jambotkar .

FOREIGN PATENT DOCUMENTS 48175  3/1982  European Pat. Off. .

OTHER PUBLICATIONS

L. M. Elijah, et al., "Etching Technique for Minimum Undercutting" IBM Technical Disclosure Bulletin, vol. 14, No. 9, Feb. 1972, p. 2607.

*Primary Examiner*—George Fourson
*Attorney, Agent, or Firm*—Wolf, Greenfield & Sacks

[57] ABSTRACT

In a method for etching a deep groove in a silicon substrate, an oxide mask is delineated according to the shape of the desired groove. The photoresist which served to form the oxide mask is removed. A new photoresist layer is deposited and etched to define a photoresist mask overlapping the edges of the oxide mask. The wafer is immersed into a chemical bath for etching the silicon to form the desired groove, partially extending beneath the oxide mask. After rinsing, the wafter is immersed into a chemical bath for etching the silicon oxide to remove the oxide cap lying over the groove and a portion of the oxide layer projecting over the substrate beyond the edges of the groove.

15 Claims, 3 Drawing Sheets

METHOD FOR ETCHING A DEEP GROOVE IN A SILICON SUBSTRATE

BACKGROUND OF THE INVENTION

1. Field of the Invention

The present invention relates to the manufacturing of semiconductor components and more particularly of power semiconductor components having deep grooves such as lateral grooves for interrupting a junction under the surface of the semiconductor component to form a so-called "mesa" structure.

2. Discussion of the Related Art

As used herein, "deep groove" is to be construed as a groove with a depth within the range 50-150 μm.

First, conventional groove etching techniques will be described with reference to FIGS. 1A-1C and 2A-2C, to point out the drawbacks of the prior art and the problems encountered therewith.

The conventional technique illustrated in FIGS. 1A-1C simply uses a photoresist mask 1 formed on a silicon substrate 2. The mask 1 comprises a window 3 serving to delineate an area for subsequent forming of a groove. Then, the wafer is immersed into a photoresist-selective bath for etching the silicon substrate 2 in the area delineated to form groove 4.

This very simple method is suitable only for etching shallow grooves, shallower than 50 μm in depth, because of the following drawbacks:

first, in the etching bath, either the bath is stirred or the substrate immersed therein is vibrated to ensure a satisfactory homogeneity of the etchant. When the substrate is vibrated, once etching has started, portions 5 (FIG. 1B) of the photoresist mask 1 are vibrated too in the directions shown by arrows 7, which photoresist mask vibration causes the photoresist mask 1 to become dislodged (unstuck) from the silicon substrate 2 upon which the mask 1 is disposed;

owing to the dislodging of the photoresist mask 1 resulting from the above operation, some etchant penetrates the substrate 2 at the interface between the photoresist mask 1 and the silicon substrate 2, causing localized overetching of the silicon under the mask, as indicated by reference character 6 in the cross-sectional view of FIG. 1B and in the top down view of FIG. 1C. The resulting poor definition of the groove edges degrades the electric properties of the resulting component;

once a groove has been formed, it is often desired, after rinsing and testing of the component, to perform an additional etching operation, so-called "reviving"; when using a photoresist mask, it is virtually impossible to perform such an additional etching operation because, after the rinse phase, the mask is further dislodged from the substrate and the etchant, therefore, would penetrate the substrate at the interface between the mask and the substrate, which etchant penetration would further degrade the component performance; and when a photoresist mask is used, it has been observed that the lateral extension of etching below the mask is substantially equal to the depth of the vertical etching. In other words, the ratio between the lateral and vertical etchings is approximately equal to 1:1.

In order to improve results obtained in the case of deep groove etchings, the conventional method illustrated in FIGS. 2A-2C has been used. With this method, the photoresist layer 1 is deposited on a silicon oxide layer 10. The silicon oxide layer 10 is etched away beneath the previously formed window 3 in the photoresist layer 1 (the mask) to form a groove 4.

This method has the following advantages over the above process. The presence of the silicon oxide layer 10, relatively rigid beneath the photoresist layer 1, prevents the overlying photoresist and oxide portions from vibrating and therefore reduces the problems caused by the dislodging of the photoresist layer. In addition, when etching is performed beneath an oxide layer, the ratio between the lateral and vertical etchings is approximately 0.75 instead of 1. The groove is, therefore, more accurately defined. Further, etching can be prolonged to provide grooves with a depth up to a few hundred yam (for example, 100-200 μm). However, this method brings about the following other drawbacks:

if the silicon oxide is relatively rigid, it is brittle and portions of the overlying silicon oxide layer may crack during the etching operation and may deposit into the groove, which will cause localized etching defects;

at the end of the etching operation, the photoresist layer is removed with a selective etchant. Then, the overlying oxide portions are conventionally broken with pressured water jets. However, some oxide caps 13, 14 (FIGS. 2B and 2C) may remain after the breaking operation;

if a reviving operation, which includes an additional etching of the silicon groove at the end of the process, is performed, a new silicon oxide cap results. The drawback of this cap (as illustrated in FIG. 2B) includes that, when a passivation product, for example glass 11, is deposited in the groove, the thickness of the glass will be reduced at the vicinity of the cap, which decreases the protection quality thereof and generates areas where electric arcs are liable to occur.

Furthermore, those skilled in the art will appreciate that, with this method, at the end of the groove etching operation, the adherence between the photoresist and the silicon oxide is not quite satisfactory, since the photoresist has been subjected to several successive aggressions, namely, the aggression resulting from the etching of the oxide layer, the aggression corresponding to the etching of the groove and to intermediate and final rinsing operations. Thus, it is hazardous with this method to etch the silicon oxide layer with a selective etchant prior to eliminating the photoresist layer because, in such a case, the etchant of the silicon oxide is at risk to deeply penetrate between the photoresist layer and silicon oxide layer, which is liable to reduce, at least locally, the thickness of the silicon oxide and to pollute sensitive areas spaced apart from the groove.

FIG. 2C shows a top down view of the groove obtained with the method described above and shown in FIGS. 2A and 2B. The groove edges are linear, as indicated by line 13, but there remain irregular protruding oxide caps 14 that may lead to deterioration of the electric properties of the component, as disclosed above.

SUMMARY OF THE INVENTION

Accordingly, an object of the invention is to provide an improved method for forming a deep groove avoiding the drawbacks of the above described conventional methods.

To achieve this object, other features and advantages of the invention, a method of the invention includes the steps of delineating an oxide mask substantially corresponding to the shape of the desired groove; removing the photoresist that served to form the oxide mask; depositing a new photoresist layer and etching the same for defining a photoresist mask overlapping the edges of the oxide mask; immersing the wafer in a bath for etching the silicon to form the desired groove, which groove partially extends beneath the oxide mask; rinsing the resulting structure; etching the silicon oxide to eliminate the oxide cap projecting over the groove and a portion of the oxide layer formed on the substrate beyond the edges of the groove; and eliminating the new photoresist layer.

According to an embodiment of the invention, the photoresist mask protrudes by approximately 20 $\mu$m from the oxide mask.

According to an embodiment of the invention, the etching of the silicon is continued until the groove flit has a depth of approximately 50–150 $\mu$m.

According to an embodiment of the invention, the silicon oxide etching step is continued until the silicon oxide is etched back with respect to the groove by approximately 10 $\mu$m.

The foregoing and other objects, features, aspects and advantages of the invention will become apparent from a reading of the following detailed description of the present invention when taken in conjunction with the accompanying drawings.

Figure 1A:
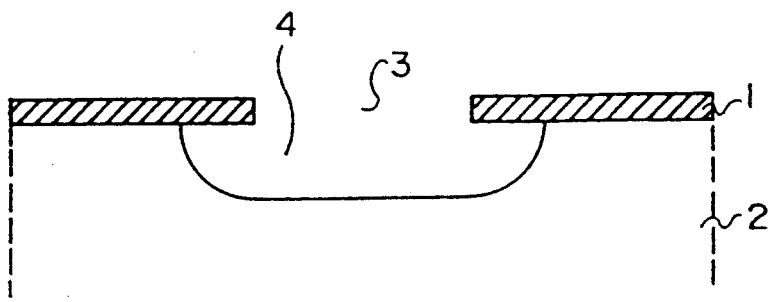
FIGS. 1A and 1B are cross-sectional views of a silicon wafer structure illustrating a first conventional groove etching method.
Figure 1B:
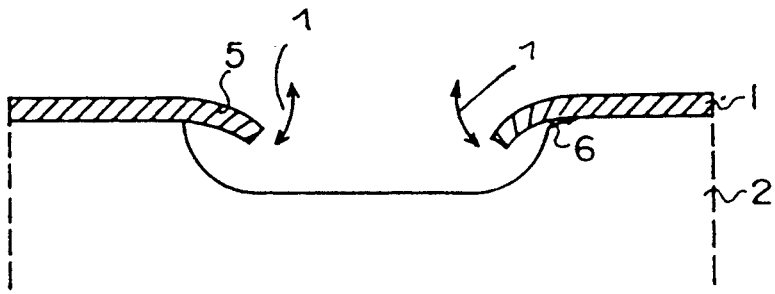
Figure 1C:
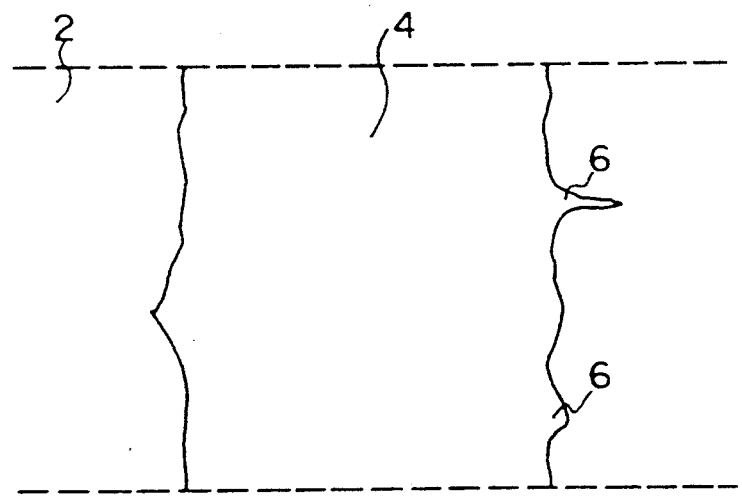
FIG. 1C is a corresponding top view illustrating the method of FIGS. 1A and 1B.

In the various figures, like reference characters designate like or analogous components. Additionally, as is conventional in semiconductor representation, it will be appreciated by those skilled in the art that the various drawings are not drawn to scale, and in particular, are arbitrarily enlarged in order to facilitate the legibility of the drawings. To determine the practical values of the various dimensions, those skilled in the art will refer to their professional knowledge and to the values indicated by way of example in the present description.

DETAILED DESCRIPTION

Figure 3A:
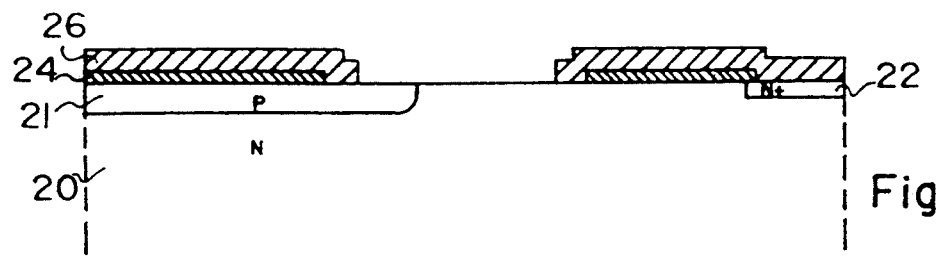
FIGS. 3A–3D are cross-sectional views of a semiconductor structure illustrating successive steps for etching a deep groove according to the invention.

FIG. 3A shows an exemplary portion of an N-type substrate 20 in which have been formed, for example, a deep P layer 21 and an N+ region 22. A groove must be formed in order to laterally delineate the junction between P layer 21 and substrate 20. For this purpose, a first silicon oxide layer 24, including a window having substantially the shape of the groove that is to be etched, is formed. It will be noted that the step of etching the silicon oxide layer 24 where it is desired to form the groove does not require any additional manufacturing step other than the conventional fabrication steps because, as shown, this silicon oxide layer is generally obtained from other manufacturing operations. Additionally, there often exists a step during which some oxide is etched away in some regions, such as at the surface of the N+ region 22, during which step the etching of the window may be performed.

Once layer 24 is suitably etched, the photoresist which served for the etching step is removed and a new photoresist layer 26 is deposited. Photoresist layer 26 is etched away where the groove is to be formed and protrudes towards the center of the groove to be formed, further than the window in oxide mask 24.

Figure 2A:
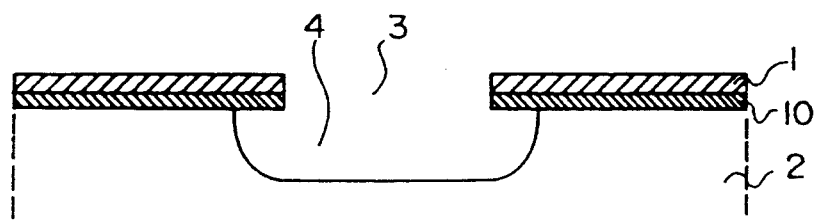
FIGS. 2A and 2B are cross-sectional views of a silicon wafer structure illustrating a second conventional groove etching method.
Figure 2B:
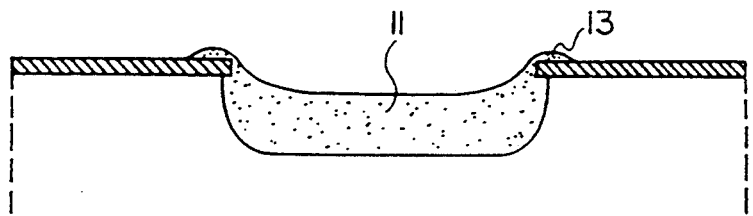
Figure 2C:
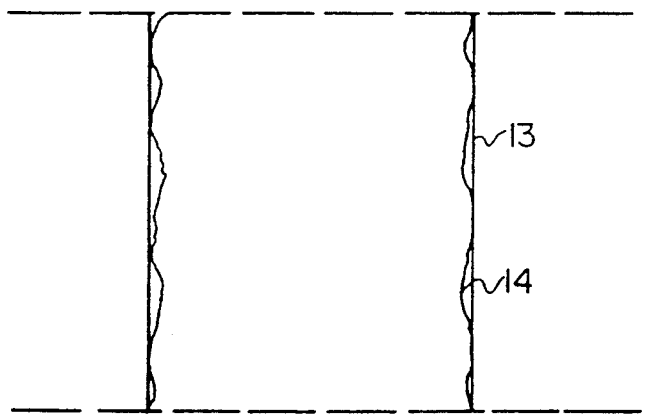
FIG. 2C is a corresponding top view illustrating the method of FIGS. 1A and 1B.
Figure 3B:
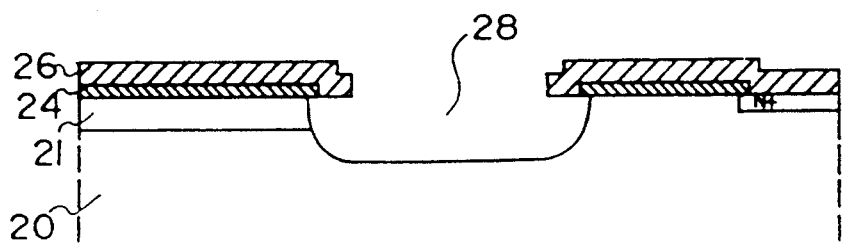

Then, the structure is immersed into a silicon etching bath and, as shown in FIG. 3B, a groove 28 is formed. In practice, if the groove must have a depth of 150 $\mu$m and if the photoresist layer projects from the edge of oxide layer 24 by approximately 20 $\mu$m, etching will laterally extend beneath the photoresist layer by approximately 20 $\mu$m and beneath the silicon oxide layer by approximately 80 $\mu$m. Hence, at the end of the etching step, the overhanging photoresist portion will be substantially carried by the silicon oxide layer which has at least the same resulting advantages as disclosed in connection with FIGS. 2A–2C, which advantages result mainly from the rigidity of the silicon oxide layer. The structure includes further advantages over the prior art which are described in more detail hereinafter.

Figure 3C:
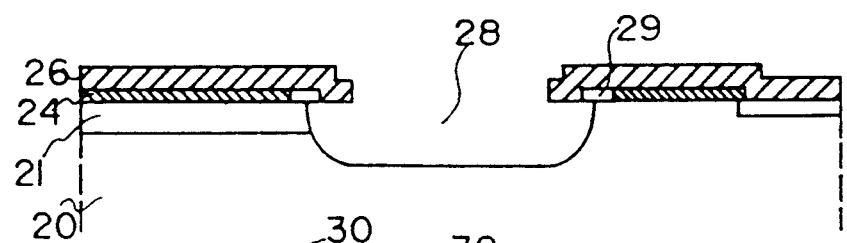

Once etching has been performed in accordance with the method shown in FIG. 3B, a rinse step is performed. Then, the wafer is immersed into a silicon oxide etching bath to provide overetching of the silicon oxide in the region 29 in FIG. 3C. This selective etching of the silicon oxide is possible because, at this stage, the adherence is good between the photoresist layer 26 and the oxide layer 24, and the etchant will not infiltrate between the photoresist and oxide. This good adherence is due to the fact that the photoresist layer 26 has been subjected to silicon etching and rinsing operations only whereas, in the conventional method shown in FIG. 2A, the photoresist layer 26 was subjected to oxide etching, first rinsing, silicon etching, and second rinsing. In addition, since the photoresist laterally covers the edge of the oxide layer, the risk of penetration is reduced.

Figure 3D:
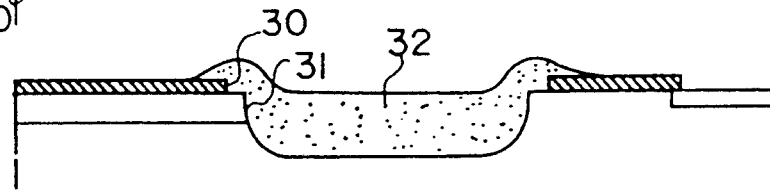
Figure 3E:
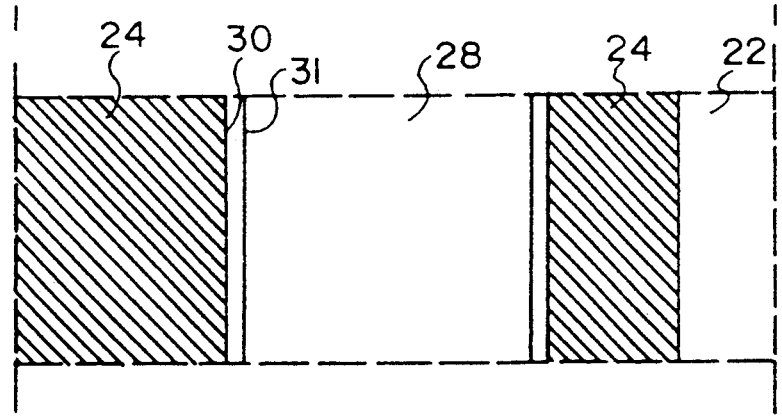
FIG. 3E is a corresponding top view illustrating the method of the invention.

At the end of these steps, the structure illustrated in the cross-sectional view of FIG. 3D and in the top view of FIG. 3E is obtained. In this structure, the edge 30 of the oxide layer is etched back with respect to edge 31 of the groove. Additionally, FIG. 3D illustrates the presence of a passivation deposit, such as a glassivation 32. It will be noted that the position of the oxide layer, which is etched back with respect to the edge of the groove, promotes the regular deposition of the glassivation product and prevents the occurrence of spikes liable to generate electric arcs.

In addition, the structure according to the invention easily lends itself to a reviving operation that can be achieved without the risk of forming a new peak cap.

By way of example, the depth of the P layer 21 can be approximately 20 $\mu$m, the depth of the groove approximately 150 $\mu$m, the thickness of the thermal $SiO_2$ layer 24 approximately 1 $\mu$m, and the thickness of the photoresist layer approximately 5 $\mu$m.

As an etchant, iodine cooled down to 10° to 20° C. can be used for etching the groove. Etching of the oxide layer at the step shown in FIG. 3C can be achieved with pure fluohydric acid which etching is continued until the edge 30 of the oxide layer is etched back by approximately 10 $\mu$m with respect to the edge 31 of the groove.

As will be apparent to those skilled in the art, various modifications can be made to the above disclosed embodiments, and in particular with respect to sizes and etchants disclosed.

Only the main steps for etching a groove have been described above. It will be clear to those skilled in the art that the device can be conventionally completed by contacting, metallization and encapsulation operations.

The foregoing description is provided by way of example only and in no way is intended on being limiting. The scope of the invention is defined in the appended claims and equivalents thereto.

What is claimed is:

1. A method for etching a groove in a silicon substrate comprising the steps of:
   delineating an oxide mask on the substrate having a window of substantially the same shape as the groove, using a first photoresist layer;
   removing the first photoresist layer;
   depositing a second photoresist layer on the oxide mask;
   etching the second photoresist layer to define a photoresist mask overlapping edges of the oxide mask yielding an intermediate structure;
   forming a groove which extends partially beneath the oxide mask by immersing the intermediate structure into a chemical bath;
   rinsing the substrate and groove yielding a substrate and groove structure; and
   immersing the substrate and groove structure into a chemical bath for etching the silicon oxide to remove an oxide cap projecting over the groove and a portion of the oxide beyond the edges of the groove.

2. A method as claimed in claim 1 further including, after the immersing the substrate and groove structure step, the step of:
   removing the photoresist mask.

3. A method as claimed in claim 1 wherein the photoresist mask overlaps the oxide mask by approximately 20 $\mu$m.

4. A method as claimed in claim 2 wherein the photoresist mask overlaps the oxide mask by approximately 20 $\mu$m.

5. A method as claimed in claim 1 wherein the silicon etching immersing step is carried out until the groove has a depth substantially within the range of 50–150 $\mu$m.

6. A method as claimed in claim 2 wherein the silicon etching immersing step is carried out until the groove has a depth substantially within the range of 50–150 $\mu$m.

7. A method as claimed in claim 3 wherein the silicon etching immersing step is carried out until the groove has a depth substantially within the range ri of 50–150 $\mu$m.

8. A method as claimed in claim 1 wherein the silicon oxide etching immersing step is carried out until the silicon oxide is etched back from an edge of the groove by approximately 10 $\mu$m.

9. A method as claimed in claim 2 wherein the silicon oxide etching immersing step is carried out until the silicon oxide is etched back from an edge of the groove by approximately 10 $\mu$m.

10. A method as claimed in claim 7 wherein the silicon oxide etching immersing step is carried out until the silicon oxide is etched back from an edge of the groove by approximately 10 $\mu$m.

11. A method for etching a groove in a silicon substrate comprising the steps of:
    depositing an oxide layer on the substrate;
    depositing a first photoresist layer on the oxide layer;
    forming an oxide mask in the oxide layer having a window of substantially the same shape as the groove;
    removing the first photoresist layer;
    depositing a second photoresist layer on the oxide mask;
    etching the second photoresist layer to define a photoresist mask overlapping edges of the oxide mask yielding an intermediate structure;
    forming the groove which extends partially beneath the oxide mask by immersing the intermediate structure into a chemical bath;
    rinsing the substrate and groove yielding a substrate and groove structure; and
    immersing the substrate and groove structure into a chemical bath for etching the silicon oxide to remove an oxide cap projecting over the groove and a portion of the oxide beyond the edges of the groove.

12. A method as claimed in claim 11 further including, after the immersing the substrate and groove structure step, the step of:
    removing the photoresist mask.

13. A method as claimed in claim 12 wherein the photoresist mask overlaps the oxide mask by approximately 20 $\mu$m.

14. A method as claimed in claim 13 wherein the silicon etching immersing step is carried out until the groove has a depth substantially within the range of 50–150 $\mu$m.

15. A method as claimed in claim 14 wherein the silicon oxide etching immersing step is carried out until the silicon oxide is etched back from an edge of the groove by approximately 10 $\mu$m.

* * * * *